United States Patent [19]

Welzhofer

[11] Patent Number: 4,636,716
[45] Date of Patent: Jan. 13, 1987

[54] DEVICE FOR TESTING UNITS CONTAINING ELECTRICAL CIRCUITS

[75] Inventor: Klaus Welzhofer, Graefelfing, Fed. Rep. of Germany

[73] Assignee: Siemens Aktiengesellschaft, Berlin and Munich, Fed. Rep. of Germany

[21] Appl. No.: 597,720

[22] Filed: Apr. 6, 1984

[30] Foreign Application Priority Data

Apr. 8, 1983 [DE] Fed. Rep. of Germany ....... 3312687

[51] Int. Cl.$^4$ ...................... G01R 15/12; G01R 31/22
[52] U.S. Cl. ............................... 324/73 R; 324/158 R
[58] Field of Search ............... 324/158 R, 73 R, 58 R; 307/362, 360; 363/134

[56] References Cited

U.S. PATENT DOCUMENTS

| | | | |
|---|---|---|---|
| 4,495,462 | 1/1985 | Weldon | 324/158 R |
| 4,523,312 | 6/1985 | Takeuchi | 324/73 R |

OTHER PUBLICATIONS

Newsom; "Implementation of I/O Contact Testing on NLT Logic Testers", 1979, IBM Technical Disclosure Bulletin, vol. 22, No. 4, Sep. 1979, p. 1344.

*Primary Examiner*—Ernest F. Karlsen
*Assistant Examiner*—Vinh Phu Nguyen
*Attorney, Agent, or Firm*—Hill, Van Santen, Steadman & Simpson

[57] ABSTRACT

For the purpose of testing units which contain electrical circuits, an interpretation circuit and a load circuit are connected to the output of the unit being tested by way of a line. A load circuit is provided which contains two constant current sources which are respectively variable in terms of current value and which are respectively connectible and disconnectible. The one constant current source therefore serves as a load current source and the three serves as a load current sink. A determination can be made, with the assistance of a variable control voltage, as to whether the load circuit operates as a current source or a current sink. The constant current source and the variable control voltage are connected to one another and to the line to the unit being tested by way of a diode bridge. A comparator circuit is connected to the same line and comprises an impedance and voltage level converter and two comparators. Separately variable reference voltages are supplied to the comparators. Three voltage ranges are thereby formed for the evaluation of the output signal of the unit being tested. The samping time of the evaluation is defined by sampling signals. The interpretation circuit and the load circuit are programmable within broad current and voltage ranges so that they can be employed to test units which belong to different circuit technologies.

7 Claims, 2 Drawing Figures

DEVICE FOR TESTING UNITS CONTAINING ELECTRICAL CIRCUITS

BACKGROUND OF THE INVENTION

1. Field of the Invention

The present invention relates to a device for testing units containing electrical circuits, whereby an interpretation circuit is provided for the interpretation of unit-under-test signals emitted by the unit being tested at a test output, and whereby a load circuit is provided for loading the output of the unit with a definable load.

2. Description of the Prior Art

Computer-controlled testing installations require programmable drive circuits and programmable interpretation circuits at every test connection for a fully-automatic testing of SSI, MSI, LSI and VLSI modules. The drive circuit must be in a position to both transmit the corresponding signal level parameters required by the data sheet of the unit being tested to an input of the unit and to execute the change of signal level of the test signal to be applied to the unit being tested with the required edge steepness. Finally, in the case of a bidirectional test connection, for example given a tri-state bus driver, the output of the drive circuit must be able to rapidly shut off to high resistance state or, respectively, switch back on. When the test connection is an output, then this must be able to be loaded according to the data sheet of the unit being tested and, in addition, the output signal of the unit being tested must be able to be interpreted chronologically and amplitude-wise by way of a suitable interpretation circuit with reference to programmable reference voltages and sampling clocks. This is the reason why a programmable load circuit and a programmable interpretation must be provided in the evaluation circuit.

Since units are to be tested in different circuit technology, for example ECL technology, TTL technology or MOS technology, etc, with the testing installation, the drive circuits and evaluation circuits must programmably cover broad current and voltage ranges in order to be universally useable. Further, strict-frequency requirements are made of such circuits in order to also be able to undertake dynamic tests given high test signal rates.

SUMMARY OF THE INVENTION

The object of the present invention is to provide a device for testing units which contain electrical circuits and which meets the stringent high frequency requirements and whose space requirement on a module is nonetheless low.

Given a device of the type generally set forth above, this object is achieved in that the input of the load circuit and the input of the interpretation circuit are connected to a line leading to a connection terminal, in that the output of the unit being tested can be connected to the connection terminal, in that at least one disconnectible constant current source, having a variable current value, is provided in the load circuit, the unit being tested being loadable by way of the constant current source, and in that at least one comparator is provided to compare the unit being tested to a variable reference voltage at a prescribable time, the comparator being included in the interpretation circuit.

It is advantageous when two constant current sources are provided in the load circuit, the one serving as a load current sink and the other serving as a load current source, whereby each constant current source is respectively separately variable with respect to current value and is respectively separately disconnectible. With such structure it is possible to load the unit being tested with different currents that can flow in opposite directions.

The connection of the constant current sources to the line leading to the connection terminal can occur by way of a diode bridge in which two junction points, lying opposite one another, are connected to the constant current sources, the third junction point being connected to a variable voltage source and the junction point lying diagonally opposite thereto is connected to the line which is connected to the connection terminal. The variable voltage source can then be utilized in order to determine whether the load current is functioning as a load current sink or a load current source, whereby the value of the variable voltage source can also be selected such that, as a function of the amplitude of the signal of the unit being tested, the load circuit first functions as a load current source or, respectively, a load current sink and subsequently functions as a load current sink or, respectively, a load current source.

It is advantageous to provide two comparators in the interpretation circuit, these being connected by way of an impedance and signal level converter to the line to the connection terminal. Different, variable reference voltages are then supplied to the comparators so that a number of voltage ranges can be formed in order to determine into which of the voltage ranges the output signal falls, of the unit being tested. It is therefore also possible to recognize tri-state positions of the output signal of the unit being tested. By way of the impedance and signal level converter it is achieved that the input resistance of the interpretation circuit is in a very high resistant state and, therefore, the output of the unit being tested is subjected to little load. Further, the test signal can be matched to the voltage values permissible for the comparators.

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
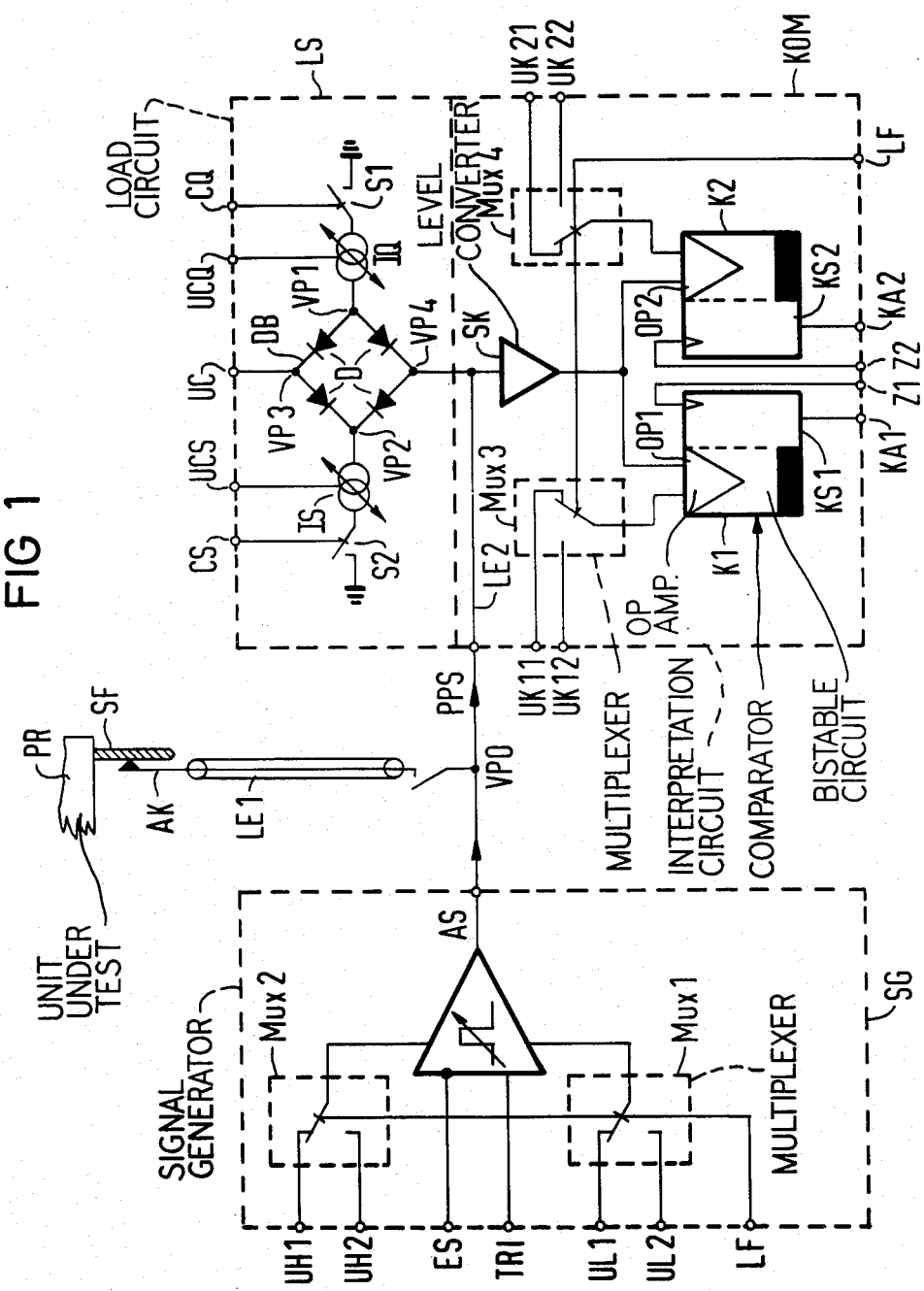
FIG. 1 is a block diagram of a device connected to a signal generator circuit.

FIG. 1 illustrates a signal generator circuit SG for generating pulse-shaped output signals or test signals, a load circuit LS and an interpretation circuit KOM. The output of the signal generator SG, the input of the interpretation circuit KOM and the input of the load circuit LS are connected to one another at a junction VPO. A line LE1 extends from the junction VPO to a connection terminal AK which is connected, for example, to a terminal pin SF of a unit under test PR. Such an interconnection of a signal generator SG, a load circuit LS and an interpretation circuit KOM is expedient when a prior determination is not to be undertaken as to whether an output of a unit to be tested or an input of such a unit is to be connected to the connection terminal AK. The output of the signal generator SG must then be constructed such that the signal generator SG cannot be destroyed by the signals of the unit being tested given a mode in which the output of the unit is connected. The load circuit LS and the interpretation circuit KOM must then be realized such that the load circuit LS and the interpretation circuit KOM do not disrupt operation given an operating mode in which an input of a unit being tested is connected.

The structure of the signal generator circuit SG is only schematically illustrated in FIG. 1. It can be seen that an input signal ES, for example a TTL signal, is supplied to the signal generator circuit and that, moreover, control voltages UL1 and UL2 are supplied by way of a first multiplexer MUX1 and control voltages UH1 and UH2 are supplied by way of a second multiplexer MUX2. The multiplexers MUX1 and MUX2 can be switched over with the assistance of a multiplexer signal LF. The control voltages UH1, UH2, UL1, UL2 can, for example, be varied between $-15$ volts and $+15$ volts. The voltage amplitude and the baseline voltage of an output signal AS provided by the signal generator circuit SG can therefore be varied in broad ranges with the assistance of the control voltages UH and UL. Finally, an inhibit signal TRI can be supplied to the signal generator circuit, the output of the signal generator circuit being switched to a higher-resistant state given the application of an inhibit signal TRI.

As illustrated in FIG. 1, the interpretation circuit KOM is connected to the junction VPO by way of a line LE2. According to the block diagram of FIG. 1, the interpretation circuit KOM comprises an impedance and voltage level converter SK and two comparators K1 and K2. The converter is connected between the line LE2 and one input each of the comparators K1 and K2. The other inputs of the comparators K1 and K2 are connected by way of respective multiplexers MUX3 and MUX4 to variable reference voltage sources that produce reference voltages UK11, UK12 and UK21, UK22. The reference voltages can thereby respectively lie between $-3$ volts and $+3$ volts. The switchover of the multiplexers MUX3 and MUX4 can again occur by way of a multiplexer signal LF.

The construction of the interpretation circuit KOM permits a selection to be digitally undertaken between two reference voltage pairs. Three voltage interpretation zones therefore derive for a unit being tested with respect to level interpretation, whereby tri-state positions of the output level PPS of the unit being tested can also be recognized. The level interpretation is chronologically triggered by sampling clocks Z1 and Z2 which are separately supplied to the comparators K1 and K2. To this end, each comparator K1, K2 can comprise an operational amplifier OP1 or, respectively, OP2 and a bistable circuit KS1 or, respectively, KS2 into which the output value of the operational amplifiers OP1 and OP2 is respectively transferred given the application of the sampling clock Z1 or Z2.

The levels of the signals of the unit being tested can be converted to the input voltages permissible for the comparators K1 and K2 with the assistance of a level converter SK. Further, the converter SK has a high-resistance input so that the interpretation circuit KOM provides an insignificant load for the output of the unit being tested.

A load circuit LS comprises a first constant current source IQ and a second constant current source IS that are connected to a diode bridge DB. The constant current sources IQ, IS are connected to those junction points of the diode bridge DB extending in the direction in which the diodes D are poled in the same direction from the source IQ to the source IS. These junction points are referenced VP1 and VP2. A variable control voltage source having a control voltage UC that can be varied between, for example, $+15$ volts and $-15$ volts is connected to a third junction point VP3 of the diode bridge DB. The line LE2, connected to the connection terminal AK, is connected to the fourth junction point VP4.

The two constant current sources IQ and IS are variable in terms of current value with the assistance of control voltages UCQ and UCS and are respectively switchable on and off by a pair of switches S1 and S2 as schematically illustrated in FIG. 1. The switching states of the switches S1 and S2 are defined by respective control voltages CQ and CS.

The load circuit LS therefore loads the output of the unit being tested with respect to current, and it can thereby operate either as a load current source or as a load current sink. The positive or negative currents output by the load circuit LS are thereby variable over a range of about 50 $\mu$A–50 mA.

Figure 2:
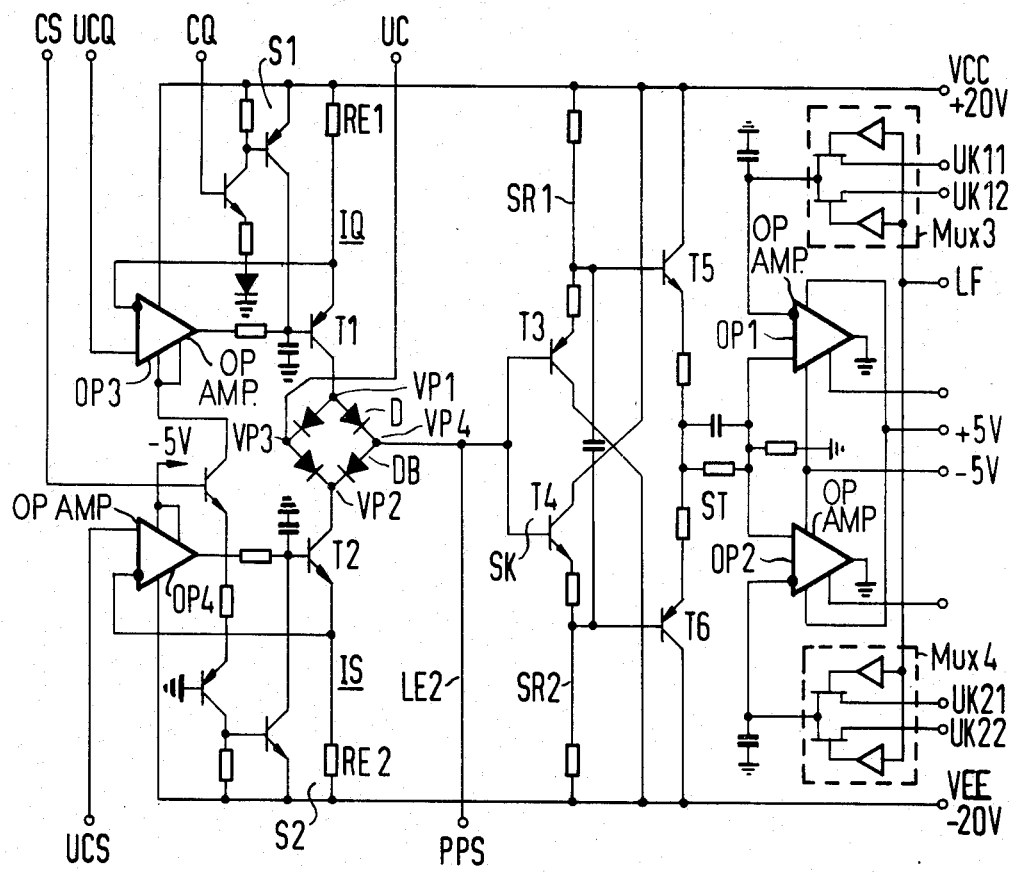
FIG. 2 is a detailed circuit diagram of a device constructed in accordance with the present invention.

The detailed structure of the load circuit LS is illustrated in FIG. 2. The constant current source IQ comprises a transistor T1 connected via an emitter resistor RE1 to a first operating potential VCC and includes a collector which is connected to the first junction point VP1 of the diode bridge DB. The switch S1, with whose assistance the transistor T1 can be inhibited, is connected to the base of the transistor T1. The control voltage CQ is supplied to the switch S1. The setting of the current value of the current source occurs with the assistance of an operational amplifier OP3 having a non-inverting input connected to receive the control voltage UCQ. The output of the operational amplifier OP3 is connected to the base of the transistor T1. Further, a feedback is provided between the emitter of the transistor T1 and the inverting input of the operational amplifier OP3. The constant current supplied to the diode bridge DB by the current source IQ can be varied by changing the control voltage UCQ.

The structure of the second constant current source IS corresponds to that of the first constant current source IQ. Transistors constructed in complementary execution are employed. The constant current source IS comprises a transistor T2 that is connected by way of an emitter resistor RE2 to the operating voltage VEE, and includes a collector connected to the junction point VP2 of the diode bridge DB. The second switch S2, for inhibiting the transistor T2, is connected to the base of the transistor T2. The control voltage CS is supplied to the switch S2. The variation of the current value that is picked up by the constant current source IS over the diode bridge DB is set with the assistance of an operational amplifier OP4 which receives the control voltage UCS at its non-inverting input and whose output is connected to the base of the transistor T2. Here, also, the feedback is provided between the emitter of the transistor T2 and the inverting input of the operational amplifier OP4. The variable voltage source having the voltage UC is connected to the third junction point VP3 of the diode bridge DB. The voltage UC determines whether the constant current source IQ or the constant current source IS loads the output of the unit being tested. The voltage UC can be selected such that the constant current of the constant current source IQ flows via the diodes D and the junction point VP4 to the line LE2, or it can be selected such that a current flows via the line LE2, the junction point VP4 and the diodes D to the constant current source IS. The voltage UC can, however, also be set such that first the one constant current source and then the other constant current source is effective given a changing level of the output signal of the unit being tested. In this case, a dynamic switching of the load circuit LS occurs as a function of the voltage level of the output signal PPS of the unit being tested.

The circuit details of the interpretation circuit KOM are also illustrated on FIG. 2. The line LE2, on which the unit being tested supplies the test signal PPS to the interpretation circuit, is connected to the impedance and voltage level converter SK. The converter SK comprises a plurality of transistors T3, T4, T5 and T6 and a voltage divider ST. The transistors T3 and T4, which are constructed complementary, are respectively connected to the line LE2 with their bases. Their collectors are connected to the operating potential VEE or, respectively, VCC. Their emitters are connected to the operating potential VCC or, respectively, VEE via a respective series connection comprising two resistors. The junction of the two resistors of the series connection SR1 is connected to the base of the transistor T5, whereas the junction of the series resistors of the series connection SR2 is connected to the base of the transistor T6. The collectors of the transistors T5 and T6 are connected to the operating potentials VCC and VEE, respectively. The emitters of the transistors T5 and T6 are connected to a voltage divider via respective resistors.

The converter SK is constructed such that it has a high input resistance and therefore insignificantly loads the output of the unit being tested and such that, on the other hand, it matches the voltage levels of the output signal of the unit being tested to the voltage values that are permissible for the operation of the comparators K1 and K2. The output of the voltage divider ST is respectively connected to an input of an operational amplifier OP1 and an operational amplifier OP2. The reference voltages UK11, UK12 via the multiplexer MUX3 or, respectively, the reference voltages UK21, UK22 via the multiplexer MUX4 are applied to the other, inverting input of the operational amplifiers OP1 and OP2, respectively, as has already been illustrated in FIG. 1. The further construction of the interpretation circuit may be derived from FIG. 1. The comparators K1 and K2 emit the output signals KA1 and KA2, respectively, from whose values the voltage range in which the level of the signal of the unit being tested lies at the sampling time Z1, Z2. The signals Z1 and Z2 and the output signals KA1 and KA2, as well as the multiplexer signal LF, can have the TTL level. This also appertains, in an analogous manner, to the voltages CS and CQ of the load circuit LS.

As FIG. 2 illustrates, the load circuit LS and the interpretation circuit KOM comprise relatively few components so that it is easily possible to construct the load circuit LS and the interpretation circuit KOM on a single function block in thick-film technology. The signal generator circuit SG of FIG. 1 can be realized in thick-film technology, either on a separate function block, or on the function block which carries the load circuit and the interpretation circuit KOM. Function blocks that are very small therefore derive so that a separate function block can be assigned to each connection element AK of the overall testing installation without a great space requirement.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An arrangement for testing units which contain electrical circuits and which provide test signals having voltage levels at an output terminal, comprising:
    a load circuit connected to the output terminal and operable to provide a predetermined load current, said load circuit comprising switches and a pair of connectible and disconnectible constant current sources connected to said switches and responsive to the operation thereof to also alternately function as current sinks for providing a variable current for loading a unit under test;
    an interpretation circuit connected to the output terminal, said interpretation circuit including at least one comparator operable to compare a test signals to a variable reference signal at a predetermined time;
    said load circuit further comprising a diode bridge including four junctions, said constant current sources connected to first and second diagonally disposed junctions of said bridge, said bridge comprising diodes poled in the same direction between said first and second junctions, a third junction connected to receive a control voltage, and a fourth junction connected to the output terminal; and
    said interpretation circuit further comprising a level converter connected to the output terminal for converting the voltage level of the unit under test into a voltage signal suitable for said comparator.

2. The arrangement of claim 1, and further comprising:
    a pair of inhibit transistor switches connected to respective constant current sources, each of said inhibit switches comprising a control input adapted to receive and on-off control voltage and a controlled section connected between an operating potential and a respective constant current source; and
    wherein each of said constant current sources comprises a transistor including a base, an emitter and a collector, an emitter resistor connecting said emitter to an operating potential, said collector connected to the respective junction of said diode bridge, and an operational amplifier including an output connected to said base, an inverting input connected to said emitter, and a non-inverting input connected to receive a control signal for adjusting current level.

3. The arrangement of claim 2, wherein:
    a variable voltage source is connected to said constant current sources to determine the current load of said constant current sources.

4. The arrangement of claim 3, wherein:
    said interpretation circuit comprises a pair of comparators, said level converter connects the outputs terminal to said comparators, and said comparators are connected to receive a plurality of reference voltages and determine whether the output signals are in one of a plurality of voltage ranges.

5. The arrangement of claim 4, wherein:

said converter comprises first, second, third and fourth transistors, each including an emitter, a collector and a base, said second and fourth transistors being complementary to said first and third transistors, first and second series-connected resistors and third and fourth series-connected resistors.

said collectors of said first and second transistors connected to respective first and second operating potentials.

said emitters of said first and second transistors respectively connected to the second and first operating potentials via the respective first and second series-connected resistors and the third and fourth series-connected resistors, said bases of said first and second transistors connected together and to the output terminal to receive test signals, said collectors of said third and fourth transistors respectively connected to the second and first operating potentials, a voltage divider, and a pair of emitter resistors connected to said emitters of said third and fourth transistors to said voltage divider.

6. The arrangement of claim 5, wherein:

each of said comparators of said interpretation circuit comprises an operational amplifier including an inverting input, a non-inverting input, and an output, said non-inverting input connected to said voltage divider, and said interpretation circuit comprises a pair of multiplexers each including inputs connected to receive different reference voltages, and an output connected to the inverting input of a respective operational amplifier of said interpretation circuit.

7. The arrangement of claim 1, and further comprising:

a signal generator for generating test pulses connected to the output terminal, and said interpretation circuit and said load circuit are constructed in hybrid technology as a single module.

* * * * *